(12) United States Patent
Kim et al.

(10) Patent No.: US 8,415,424 B2
(45) Date of Patent: Apr. 9, 2013

(54) AROMATIC RING-CONTAINING POLYMER FOR UNDERLAYER OF RESIST AND RESIST UNDERLAYER COMPOSITION INCLUDING THE SAME

(75) Inventors: Min-Soo Kim, Uiwang-si (KR); Hwan-Sung Cheon, Uiwang-si (KR); Sung-Wook Cho, Uiwang-si (KR); Seung-Bae Oh, Uiwang-si (KR); Jee-Yun Song, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 0 days.

(21) Appl. No.: 13/540,202

(22) Filed: Jul. 2, 2012

(65) Prior Publication Data
US 2012/0270994 A1    Oct. 25, 2012

Related U.S. Application Data

(63) Continuation of application No. PCT/KR2010/006948, filed on Oct. 11, 2010.

(30) Foreign Application Priority Data

Dec. 31, 2009   (KR) .................. 10-2009-0136186

(51) Int. Cl.
  *C08L 29/14*   (2006.01)
  *C08F 216/34*  (2006.01)
  *G03C 1/00*    (2006.01)
  *C08F 8/00*    (2006.01)

(52) U.S. Cl.
  USPC ........ 524/553; 525/328.7; 525/355; 526/280; 526/281; 526/284; 430/270.1

(58) Field of Classification Search ............... 526/280, 526/281, 284; 524/553, 554; 430/270.1, 430/286.1; 525/328.7, 355
See application file for complete search history.

(56) References Cited

U.S. PATENT DOCUMENTS

| | | | |
|---|---|---|---|
| 7,037,994 B2 * | 5/2006 | Sugita et al. ........... 526/284 |
| 7,416,833 B2 | 8/2008 | Hatakeyama et al. | |
| 7,632,624 B2 | 12/2009 | Hatakeyama et al. | |
| 7,655,386 B2 | 2/2010 | Hyung et al. | |
| 2002/0086934 A1 | 7/2002 | Kawaguchi et al. | |
| 2006/0014106 A1 | 1/2006 | Hatakeyama et al. | |
| 2006/0251990 A1 | 11/2006 | Uh et al. | |
| 2006/0269867 A1 | 11/2006 | Uh et al. | |
| 2007/0003863 A1 | 1/2007 | Uh et al. | |
| 2007/0059635 A1 | 3/2007 | Oh et al. | |
| 2007/0072111 A1 | 3/2007 | Oh et al. | |
| 2007/0264596 A1 * | 11/2007 | Ohsawa et al. ........... 430/311 |
| 2007/0275325 A1 | 11/2007 | Hatakeyama et al. | |
| 2008/0090179 A1 | 4/2008 | Takeda et al. | |
| 2008/0118875 A1 | 5/2008 | Kim et al. | |
| 2008/0153033 A1 | 6/2008 | Hyung et al. | |
| 2008/0160460 A1 | 7/2008 | Yoon et al. | |
| 2008/0160461 A1 | 7/2008 | Yoon et al. | |
| 2009/0176165 A1 | 7/2009 | Cheon et al. | |
| 2009/0186298 A1 | 7/2009 | Ohsawa et al. | |
| 2009/0226824 A1 | 9/2009 | Kim et al. | |
| 2009/0226843 A1 * | 9/2009 | Hatakeyama et al. ..... 430/286.1 |
| 2010/0021830 A1 | 1/2010 | Kim et al. | |
| 2010/0279509 A1 | 11/2010 | Kim et al. | |
| 2011/0275019 A1 | 11/2011 | Yoon et al. | |

FOREIGN PATENT DOCUMENTS

| | | |
|---|---|---|
| JP | 2001-040293 A | 2/2001 |
| JP | 2002-214777 A | 7/2002 |
| KR | 10 2005-0121863 A | 12/2005 |
| KR | 10 2006-0050165 A | 5/2006 |
| KR | 10 2006-0116133 A | 11/2006 |
| KR | 10 2006-0122449 A | 11/2006 |
| KR | 10 2006-0132069 A | 12/2006 |
| KR | 10 2006-0132070 A | 12/2006 |
| KR | 10-0665758 B1 | 12/2006 |
| KR | 10-0671114 B1 | 1/2007 |
| KR | 10-0671116 B1 | 1/2007 |
| KR | 10-0671117 B1 | 1/2007 |
| KR | 10-0697979 B1 | 3/2007 |
| KR | 10 2007-0113998 A | 11/2007 |
| KR | 10 2007-0114866 A | 12/2007 |
| KR | 10-0792045 B1 | 12/2007 |
| KR | 10-0796047 B1 | 1/2008 |
| KR | 10-0816735 B1 | 3/2008 |
| KR | 10-0819162 B1 | 3/2008 |
| KR | 10 2008-0033879 A | 4/2008 |
| KR | 10-0826104 B1 | 4/2008 |
| KR | 10-0833212 B1 | 5/2008 |
| KR | 10 2008-0057927 A | 6/2008 |
| KR | 10-0836675 B1 | 6/2008 |
| KR | 10 2008-0062963 A | 7/2008 |
| KR | 10 2008-0063243 A | 7/2008 |
| KR | 10-0866015 B1 | 10/2008 |
| KR | 10 2008-0107208 A | 12/2008 |
| KR | 10 2008-0107210 A | 12/2008 |
| KR | 10 2009-0068444 A | 6/2009 |
| KR | 10 2009-0077618 A | 7/2009 |
| KR | 10 2009-0079828 A | 7/2009 |
| WO | WO 2007/139268 A1 | 12/2007 |
| WO | WO 2008/075860 A1 | 6/2008 |

OTHER PUBLICATIONS

International Search Report in PCT/KR2010/006948, dated Jun. 3, 2011 (Kim, et al.).

* cited by examiner

*Primary Examiner* — Fred M Teskin
(74) *Attorney, Agent, or Firm* — Lee & Morse, P.C.

(57) ABSTRACT

An aromatic ring-containing polymer for an underlayer of a resist, including a unit structure represented by Chemical Formula 1:

Chemical Formula 1

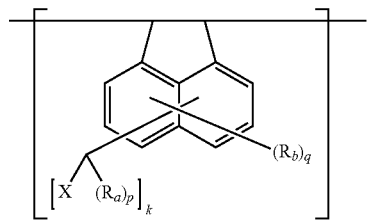

12 Claims, No Drawings

AROMATIC RING-CONTAINING POLYMER FOR UNDERLAYER OF RESIST AND RESIST UNDERLAYER COMPOSITION INCLUDING THE SAME

CROSS-REFERENCE TO RELATED APPLICATIONS

This application is a continuation under 35 U.S.C. §120 of pending International Application No. PCT/KR 2010/006948, entitled "Aromatic Ring-Containing Polymer for Underlayer of Resist and Resist Underlayer Composition Including the Same," which was filed on Oct. 11, 2010, the entire contents of which are hereby incorporated by reference.

This application claims priority under 35 U.S.C. §119 to Korean Patent Application No. 10-2009-0136186, filed on Dec. 31, 2009, in the Korean Intellectual Property Office, and entitled: "Aromatic Ring-Containing Polymer for Underlayer of Resist and Resist Underlayer Composition Including the Same," the entire contents of which is hereby incorporated by reference.

BACKGROUND

Embodiments relate to an aromatic ring-containing polymer for an underlayer of a resist and a resist underlayer composition including the same.

SUMMARY

Embodiments are directed to an aromatic ring-containing polymer for an underlayer of a resist, including a unit structure represented by Chemical Formula 1:

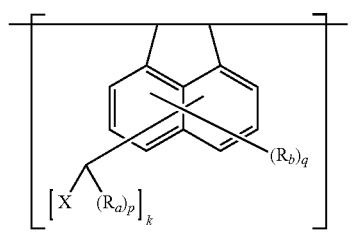

Chemical Formula 1 wherein, in Chemical Formula 1, p may be an integer ranging from 1 to 2, q may be an integer ranging from 0 to 5, k may be an integer ranging from 1 to 6, and q+k may be an integer ranging from 1 to 6, X may be a hydroxyl group (—OH), a substituted or unsubstituted C1 to C10 alkoxy group, or a substituted or unsubstituted C6 to C30 aryloxy group, $R_a$ may be a substituted or unsubstituted C1 to C10 alkyl group, a substituted or unsubstituted C3 to C8 cycloalkyl group, a substituted or unsubstituted C6 to C30 aryl group, a substituted or unsubstituted C2 to C10 alkenyl group, or a halogen, and $R_b$ may be hydrogen, a substituted or unsubstituted C1 to C10 alkyl group, a substituted or unsubstituted C3 to C8 cycloalkyl group, or a substituted or unsubstituted C6 to C30 aryl group.

The aromatic ring-containing polymer may further include a unit structure represented by Chemical Formula 2:

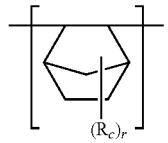

Chemical Formula 2 wherein, in Chemical Formula 2, r may be an integer ranging from 1 to 8, and $R_c$ may be hydrogen, a substituted or unsubstituted C1 to C10 alkyl group, a substituted or unsubstituted C3 to C8 cycloalkyl group, or a substituted or unsubstituted C6 to C30 aryl group.

The unit structure represented by Chemical Formula 2 may be included in the aromatic ring-containing polymer at an amount of about 1 to about 10 moles based on 1 mole of the unit structure represented by Chemical Formula 1.

$R_a$ of Chemical Formula 1 may be selected from the group of the following Chemical Formulae 1-1 to 1-12:

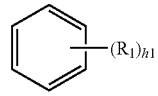

Chemical Formula 1-1

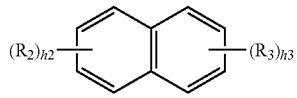

Chemical Formula 1-2

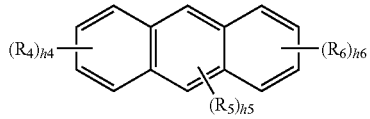

Chemical Formula 1-3

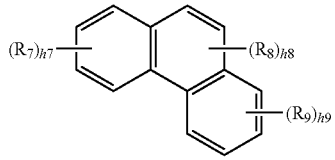

Chemical Formula 1-4

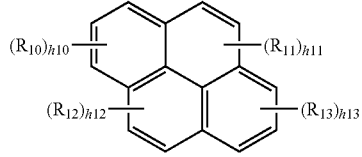

Chemical Formula 1-5

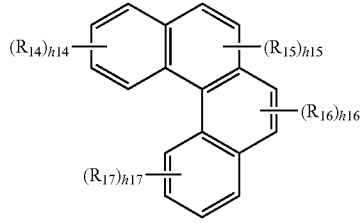

Chemical Formula 1-6

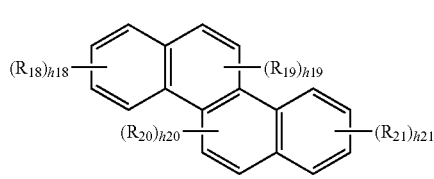

Chemical Formula 1-7

-continued

Chemical Formula 1-8

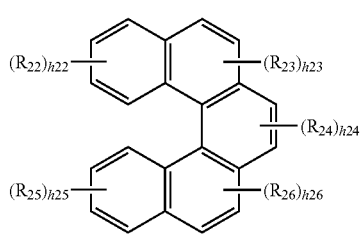

Chemical Formula 1-9

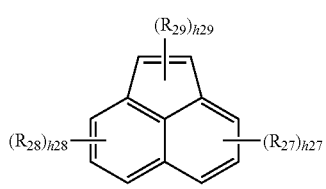

Chemical Formula 1-10

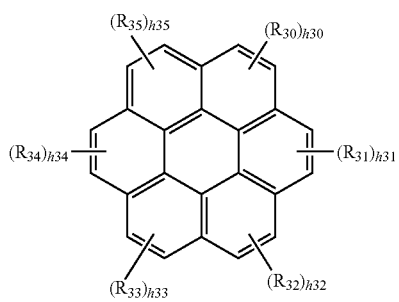

Chemical Formula 1-11

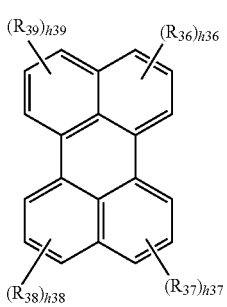

Chemical Formula 1-12

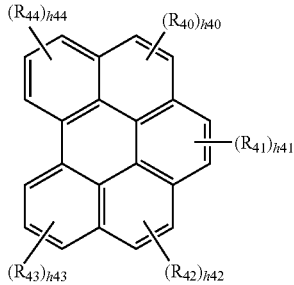

wherein, in Chemical Formulae 1-1 to 1-12, $R_1$ to $R_{44}$ each independently may be hydrogen, a hydroxyl group (—OH), an alkyl group, an aryl group, an alkenyl group, or a halogen, and $h_1$ to $h_{44}$ each independently may be an integer ranging from 0 to k−1, wherein k corresponds to a total number of hydrogen of each aromatic ring.

The aromatic ring-containing polymer may have a weight average molecular weight of about 2,000 to about 10,000

Embodiments are also directed to a resist underlayer, including a resist underlayer polymer, wherein the resist underlayer polymer may be formed by cross-linking the aromatic ring-containing polymer.

The resist underlayer may have an extinction coefficient at 248 nm of about 0.30 or more.

Embodiments are also directed to a resist underlayer composition, including an organic solvent, and the aromatic ring-containing polymer The aromatic ring-containing polymer may be included in the resist underlayer composition at an amount of about 1 to about 20 wt %.

The resist underlayer composition may further include a surfactant.

The resist underlayer composition may further include a cross-linking component.

DETAILED DESCRIPTION

Example embodiments will now be described more fully hereinafter; however, these embodiments are provided so that this disclosure will be thorough and complete, and will fully convey the scope of the invention to those skilled in the art.

It will be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

In the present specification, the term "substituted" may refer to one substituted with at least a substituent selected from the group of a hydroxyl group, a halogen, a C1 to C10 alkyl group, a C6 to C20 aryl group, and a C2 to C10 alkenyl group.

As used herein, when a specific definition is not otherwise provided, an alkyl group is a C1 to C10 alkyl group, an aryl group is a C6 to C20 aryl group, and an alkenyl group is a C2 to C10 alkenyl group such as a vinyl group or an allyl group.

According to an embodiment, an aromatic ring-containing polymer for an underlayer of a resist may include a unit structure represented by the following Chemical Formula 1.

Chemical Formula 1

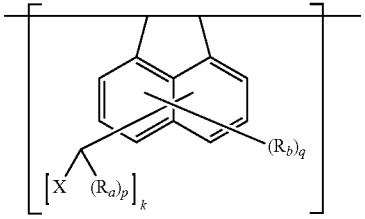

In Chemical Formula 1, p may be an integer ranging from 1 to 2, q may be an integer ranging from 0 to 5, k may be an integer ranging from 1 to 6, and q+k may be an integer ranging from 1 to 6;

X may be a hydroxyl group (—OH), a substituted or unsubstituted C1 to C10 alkoxy group, or a substituted or unsubstituted C6 to C30 aryloxy group;

$R_a$ may be a substituted or unsubstituted C1 to C10 alkyl group, a substituted or unsubstituted C3 to C8 cycloalkyl group, a substituted or unsubstituted C6 to C30 aryl group, a substituted or unsubstituted C2 to C10 alkenyl group, or a halogen; and $R_b$ may be hydrogen, a substituted or unsubstituted C1 to C10 alkyl group, a substituted or unsubstituted C3 to C8 cycloalkyl group, or a substituted or unsubstituted C6 to C30 aryl group.

In the above Chemical Formula 1, substituents substituted at an acenaphthene structure are drawn so that the substituents cross two benzene rings in order to indicate that the substituents are present at either one or both of the benzene rings.

The aromatic ring-containing polymer including the unit structure represented by Chemical Formula 1 may include an aromatic ring having a strong absorption at a short wavelength region (particularly 193 nm, 248 nm, and so on) in a polymer backbone, and therefore may be used as an anti-reflection coating. At the side chain, functional groups represented by X and $R_a$ may be introduced, which may improve etching selectivity, resistance for multiple etching, and heat resistance.

In Chemical Formula 1, $R_a$ may be selected from the group of the following Chemical Formulae 1-1 to 1-12.

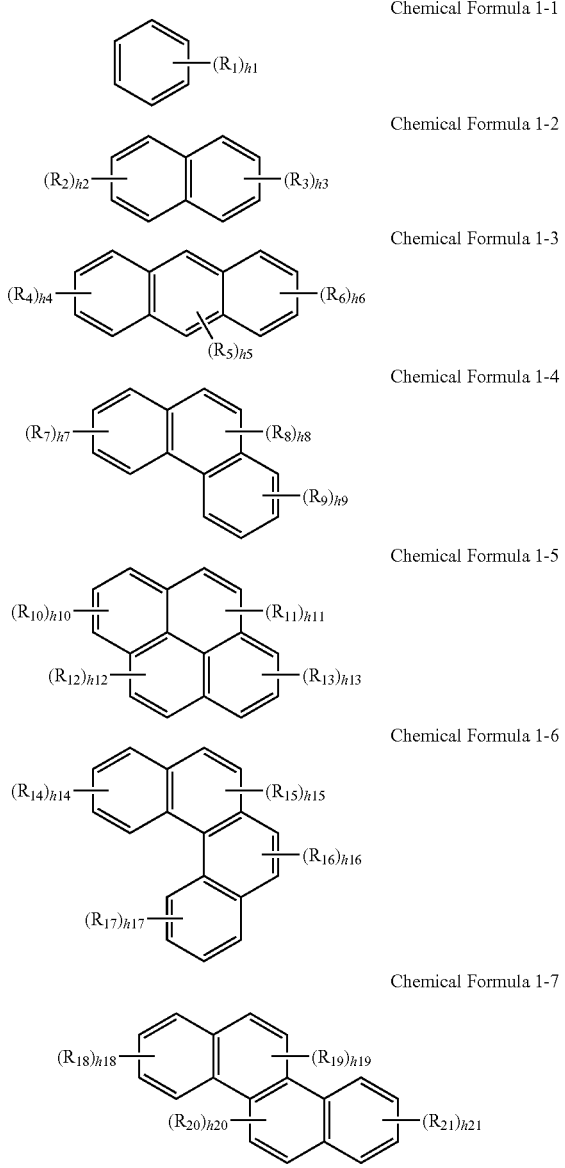

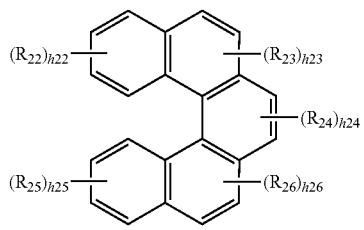

[Chemical Formula 1-8]

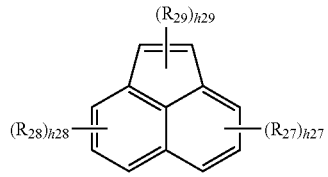

Chemical Formula 1-9

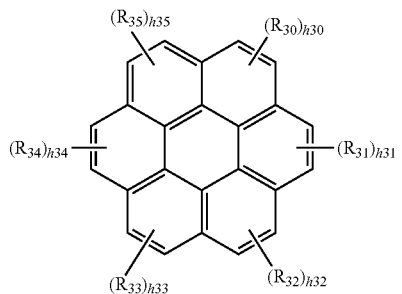

Chemical Formula 1-10

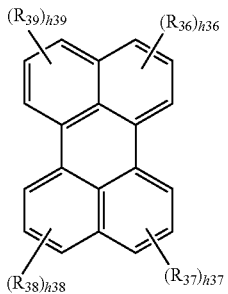

Chemical Formula 1-11

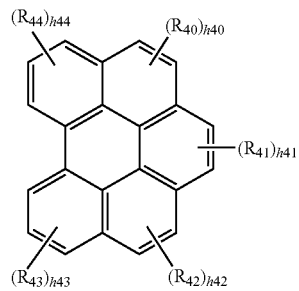

Chemical Formula 1-12

In Chemical Formulae 1-1 to 1-12, $R_1$ to $R_{44}$ each independently may be hydrogen, a hydroxyl group, an alkyl group, an aryl group, an alkenyl group, or a halogen; and $h_1$ to $h_{44}$ each independently may be an integer ranging from 0 to k−1, wherein k corresponds to the total number of hydrogen of each aromatic ring.

The aromatic ring-containing polymer may further include a unit structure represented by the following Chemical Formula 2.

Chemical Formula 2

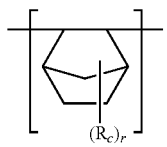

In Chemical Formula 2, r may be an integer ranging from 1 to 8; and $R_c$ may be hydrogen, a substituted or unsubstituted C1 to C10 alkyl group, a substituted or unsubstituted C3 to C8 cycloalkyl group, or a substituted or unsubstituted C6 to C30 aryl group.

The unit structure represented by Chemical Formula 2 may be included in the aromatic ring-containing polymer in an amount of about 1 to about 10 moles based on 1 mole of the unit structure represented by Chemical Formula 1. Further, the unit structure represented by Chemical Formula 2 may be included in the aromatic ring-containing polymer in an amount of about 1 to about 3 moles based on 1 mole of the unit structure represented by Chemical Formula 1. When the unit structure represented by Chemical Formula 2 is included within the above range, etching resistance may be improved.

The copolymer including unit structures represented by Chemical Formula 1 and Chemical Formula 2 may be a suitable type of copolymer (e.g., a random copolymer, a block copolymer, or an alternate copolymer).

The aromatic ring-containing polymer may have a weight average molecular weight of about 2,000 to about 10,000. When the aromatic ring-containing polymer has a weight average molecular weight within the above range, an improved coating thickness or thin film may be obtained.

According to an embodiment, a resist underlayer composition may include the aromatic ring-containing polymer. The aromatic ring-containing polymer may be a homopolymer including the unit structure represented by Chemical Formula 1, or a copolymer including unit structures represented by the Chemical Formula 1 and Chemical Formula 2.

The aromatic ring-containing polymer according to an embodiment may be cross-linked under a high temperature even without using a specific catalyst, so an additional catalyst for the cross-linking reaction may not be required. Thereby, problems related to etching property deterioration caused by contaminating a resist or a substrate with a catalyst, particularly an acid catalyst, may be prevented.

Further, the resist underlayer composition may include an organic solvent. As for the organic solvent, a suitable organic solvent having sufficient solubility for the polymer may be used. Examples of the organic solvent include propylene glycol monomethylether acetate (PGMEA), propylene glycol monomethylether (PGME), cyclohexanone, ethyl lactate, γ-butyrolactone (GBL), acetyl acetone, and the like.

In the resist underlayer composition according to an embodiment, the aromatic ring-containing polymer may be included in the resist underlayer composition in an amount of about 1 to about 20 wt %, and preferably about 3 to about 10 wt %. When the aromatic ring-containing compound is included within the above range, a desirable coating thickness of a resist underlayer may be appropriately adjusted.

The organic solvent may be used at a balance amount, (e.g., about 80 to about 99 wt %). When the organic solvent is included within the above range, a desirable coating thickness of an underlayer may be appropriately adjusted.

The resist underlayer composition according to an embodiment may further include an acid catalyst. The content of the acid catalyst may range from about 0.001 to about 0.05 parts by weight based on 100 parts by weight of the resist underlayer composition. When the content of the acid catalyst is within the above range, an appropriate cross-linking characteristic and high storage stability may be acquired. The acid catalyst may include a suitable acid catalyst (e.g., p-toluenesulfonic acid mono hydrate, pyridinium p-toluene sulfonate, 2,4,4,6-tetrabromocyclohexadieneone, benzoin tosylate, 2-nitrobenzyl tosylate, an alkyl ester of an organic sulfonic acid, etc.).

The resist underlayer composition according to an embodiment may further include a surfactant. The content of the surfactant may range from about 0.01 to about 1 parts by weight based on 100 parts by weight of the resist underlayer composition. When the content of the surfactant is within the range, improved coating performance of the resist underlayer composition may be obtained. A suitable surfactant may be used (e.g., an alkylbenzene sulfonic acid salt, an alkyl pyridinium salt, polyethylene glycol, quaternary ammonium salt, etc.).

The resist underlayer composition according to an embodiment may further include a cross-linking component. The amount of the cross-linking component may range from about 0.1 to about 5 parts by weight, or about 0.1 to about 3 parts by weight, based on 100 parts by weight of the resist underlayer composition. When the amount of the cross-linking component falls within the above range, an appropriate cross-linking characteristic may be acquired while not changing the optical properties of the formed underlayer.

The cross-linking component may further accelerate the self cross-linkage of polymer, so it may include a cross-linking agent that reacts with a hydroxyl group of the polymer in a manner that is catalyzed by the generated acid. Examples of cross-linking component may include a melamine resin, an amino resin, a glycoluril compound, a bisepoxy compound, or a mixture thereof.

Examples of suitable crosslinking components include etherified amino resins, methylated melamine resins (e.g., N-methoxymethyl-melamine resins), butylated melamine resins (e.g., N-butoxymethyl-melamine resins), methylated and butylated urea resins (e.g., Cymel U-65 Resin, UFR 80 Resin, etc.), glycoluril derivatives (e.g., Powderlink 1174) represented by the following Chemical Formula 3, and 2,6-bis(hydroxymethyl)-p-cresol. Bisepoxy-based compounds represented by the following Chemical Formula 4 and melamine-based compounds represented by the following Chemical Formula 5 may also be used as a cross-linking component.

Chemical Formula 3

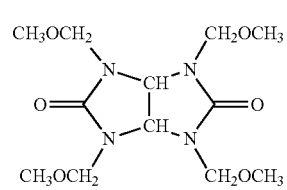

Chemical Formula 4

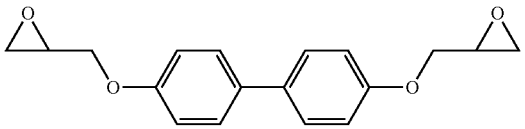

-continued

Chemical Formula 5

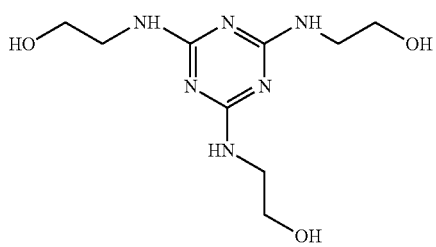

In an embodiment, the resist underlayer composition may be used in a method of forming a pattern of a device.

In the method of forming a pattern of a device, first, a material layer may be formed on a substrate.

The substrate may be a silicon substrate (e.g., a wafer), and the material layer may be made of a conductive, semi-conductive, magnetic, or insulating material such as aluminum, silicon nitride (SiN), and the like. The material layer may be provided using a suitable technique.

Thereafter, a resist underlayer may be provided using a resist underlayer composition according to an embodiment. The thickness, baking temperature, and baking time of the resist underlayer layer may be a suitable thickness, baking temperature, and baking time. For example, the resist underlayer composition may be coated at a thickness of about 500 to about 4000 Å followed by baking to provide a resist underlayer. The coating process may be performed using a spin coating process, and the baking process may be performed at about 100 to about 500° C. for about 10 seconds to about 10 minutes.

A resist layer (e.g., an irradiation-sensitive imaging layer) may be provided on the resist underlayer layer. The resist layer may be formed by a suitable process of applying the photosensitive resist composition and performing a baking process.

Before the resist layer is formed, the process of forming a silicon-containing resist underlayer or a bottom anti-refractive coating layer may be further performed. A process of forming a bottom anti-refractive coating layer on the silicon-containing resist underlayer may be further performed. The formation of the silicon-containing resist underlayer and the formation of the antireflective coating layer may be a suitable formation process.

Subsequently, the resist layer may be exposed. For the exposure process, diverse exposure light sources may be used, such as ArF, KrF, extreme ultraviolet rays (EUV), and an E-beam. When the exposure is completed, a baking process may be performed to induce a chemical reaction in the exposed region. The baking process may be performed at a temperature ranging from about 90 to 120° C. for about 60 to 90 seconds. The resist underlayer may receive the pattern from the patterned resist layer.

In order to remove portions of the resist underlayer and resist layer, a development process may be performed. The development process may be performed using a basic aqueous solution. Examples of the basic aqueous solution for development include a tetramethyl ammonium hydroxide (TMAH) aqueous solution. When the exposure light source is an ArF excimer laser, a line-and-space pattern of about 80 to about 100 nm may be obtained using a dose of 5 to 30 mJ/cm2.

Using the obtained pattern as a resist pattern, a plasma of etching gases (e.g., halogen gases or fluorocarbon gases of $CHF_3$, $CF_4$, and the like) may be used to etch the material layer. Subsequently, the resist pattern remaining on the substrate may be removed using a stripper to thereby form a desired pattern.

Through the process, a semiconductor integrated circuit device may be provided. Therefore, the composition and lithographic structure prepared according to an embodiment may be used for manufacturing and designing an integrated circuit device according to a semiconductor manufacturing process. For example, the composition and lithographic structure prepared according to an embodiment may be used for forming patterned material layer structures, such as a metal line, a hole for contact or bias, an insulation section (e.g., a damascene trench (DT) or shallow trench isolation (STI) structure), and a trench for a capacitor structure.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

Synthesis Example 1

Synthesis of Copolymer of
1-acenaphthen-5-yl-ethanol and Norbornylene

Synthesis Example 1-1

Synthesis of Copolymer of 1-formyl-acenaphthylene and Norbornylene

A 5,000 ml 3-neck flask having a thermometer, a condenser, and a mechanical agitator was prepared and dipped into an oil thermostat at 20° C. It was agitated on a hot plate by a magnet at a constant temperature, and the cooling water temperature of condenser was set at 5° C. 30.44 g of 0.2 mol 1-formyl-acenaphthylene and 56.50 g of 0.6 mol norbornylene were introduced into the reactor and dissolved in 250 ml of 1,2-dichloroethane and agitated for 30 minutes. 2.3 g of 0.01 mol polymerization initiator of AIBN was slowly introduced thereto and reacted for about 12 hours.

The molecular weight was measured at a certain interval of time to determine the reaction completion time. A sample for measuring the molecular weight was prepared by taking 1 g of reactant, quenching at room temperature, taking 0.02 g thereof, and then diluting in a solvent of tetrahydrofuran (THF) to provide 4 wt % of solid concentration. Then the reactant was slowly cooled to room temperature.

Synthesis Example 1-2

Introduction of Substituent

After completing the polymerization, the copolymer obtained from Synthesis Example 1-1 was cooled to room temperature and slowly combined with 8.5 g of 0.071 mol methyl magnesium bromide. While maintaining the temperature at room temperature, the reaction was performed for about 3 hours and completed with 300 ml of distilled water. The organic layer was washed with sufficient water to separate only the organic layer, and residual water was removed by magnesium sulfate. After filtering the solid, the solvent was completely removed under the reduced pressure.

From the result of measuring the weight average molecular weight and the polydispersity under tetrahydrofuran by GPC, it was confirmed that the polymer (n1:n2 mole ratio=1:2) represented by the following Chemical Formula 6 had a weight average molecular weight of 4,000 and a polydispersity of 1.58.

Chemical Formula 6

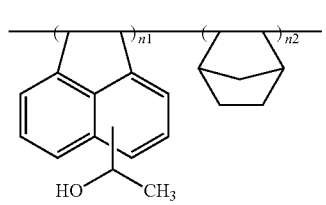

Synthesis Example 2

Synthesis of Copolymer of acenaphthen-5-yl-naphthalen-2-yl-methanol and Norbornylene A copolymer was synthesized in accordance with the same procedure as in Synthesis Example 1, except that 11.88 g of 0.071 mol naphthyl magnesium bromide was added to the copolymer synthesized from Synthesis Example 1-1 in a reactor.

From the result of measuring the weight average molecular weight and the polydispersity of the copolymer under tetrahydrofuran by GPC, it was confirmed that the polymer (n1:n2 mole ratio=1:3) represented by the following Chemical Formula 7 had a weight average molecular weight of 4,300 and a polydispersity of 1.72.

Chemical Formula 7

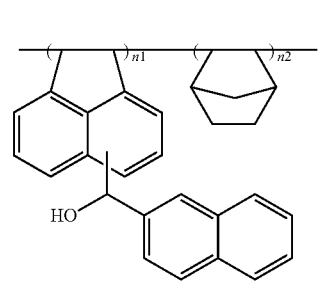

Synthesis Example 3

Synthesis of Copolymer of acenaphthen-5-yl-cyclohexan-2-yl-methanol and Norbornylene A copolymer was synthesized in accordance with the same procedure as in Synthesis Example 1, except that 9.21 g of 0.071 mol cyclohexyl magnesium bromide was added to the copolymer synthesized from Synthesis Example 1-1 in a reactor.

From the result of measuring the weight average molecular weight and the polydispersity of the copolymer under tetrahydrofuran by GPC, it was confirmed that the polymer (n1:n2 mole ratio=1:1) represented by the following Chemical Formula 8 had a weight average molecular weight of 3,800 and a polydispersity of 1.61.

Chemical Formula 8

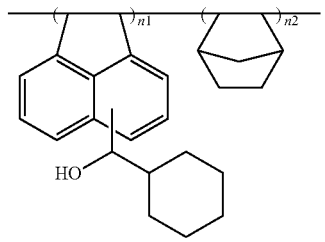

Synthesis Example 4

Synthesis of acenaphthen-5-yl-phenyl-2-yl-methanol Polymer

Synthesis Example 4-1

Polymerization of 1-formyl-acenaphthylene

A 5,000 ml 3-neck flask having a thermometer, a condenser, and a mechanical agitator was prepared and dipped into an oil thermostat at 20° C. It was agitated on a hot plate by a magnet at a constant temperature, and the cooling water temperature of condenser was set at 5° C. 30.44 g of 0.2 mol 1-formyl-acenaphthylene was introduced into the reactor and dissolved in 250 ml of 1,2-dichloroethane and agitated for 30 minutes. 2.3 g of 0.01 mol polymerization initiator of AIBN was slowly introduced thereto and reacted for about 12 hours.

The molecular weight was measured at a certain interval of time to determine the reaction completion time. A sample for measuring the molecular weight was prepared by taking 1 g of reactant, quenching at room temperature, taking 0.02 g thereof, and then diluting in a solvent of tetrahydrofuran (THF) to provide 4 wt % of solid concentration. Then the reactant was slowly cooled to room temperature.

Synthesis Example 4-2

Introduction of Substituent

After completing the polymerization, it was cooled to room temperature and slowly combined with 8.8 g of 0.071 mol phenyl magnesium bromide. While maintaining the temperature at room temperature, the reaction was performed for about 3 hours and completed with 300 ml of distilled water. The organic layer was washed with sufficient water to separate only the organic layer, and the residual amount of water was removed by magnesium sulfate. After filtering the solid, the solvent was completely removed under the reduced pressure.

From the result of measuring the weight average molecular weight and the polydispersity of the copolymer under tetrahydrofuran by GPC, it was confirmed that the polymer represented by the following Chemical Formula 9 had a weight average molecular weight of 4,200 and a polydispersity of 1.63.

Chemical Formula 9

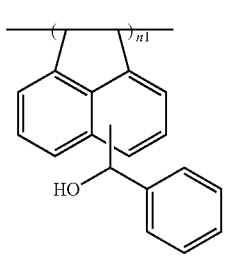

Chemical Formula 11

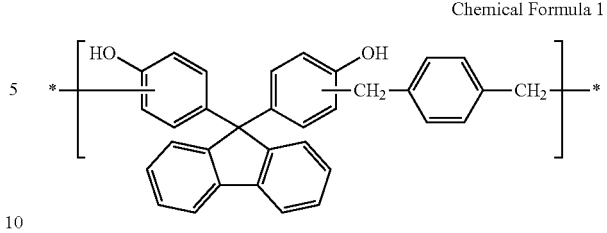

Synthesis Example 5

Synthesis of Copolymer of 1-acenaphthen-5-yl-buten-3-1-ol and Norbornylene

A copolymer was synthesized in accordance with the same procedure as in Synthesis Example 1, except that 8.54 g of 0.071 mol allyl magnesium bromide was added to the copolymer synthesized from Synthesis Example 1-1 in a reactor.

From the result of measuring the weight average molecular weight and the polydispersity of the copolymer under tetrahydrofuran by GPC, it was confirmed that the polymer (n1:n2 mole ratio=1:2) represented by the following Chemical Formula 10 had a weight average molecular weight of 4,100 and a polydispersity of 1.68.

Chemical Formula 10

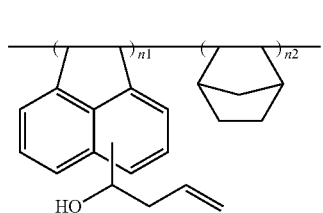

Comparative Synthesis Example 1

Synthesis of Copolymer of Fluorenylidene Diphenol and α,α'-dichloro-p-xylene 8.75 g (0.05 mol) of α,α'-dichloro-p-xylene, 26.66 g of aluminum chloride, and 200 g of γ-butyrolactone were introduced into 1 l 4-neck flask having a mechanical agitator, a condenser, 300 ml add in a dropwise funnel, and a nitrogen gas inlet and well stirred while flowing nitrogen gas in. After 10 minutes, 35.03 g (0.10 mol) of 4,4'-(9-fluorenylidene) diphenol was dissolved into 200 g of γ-butyrolactone to provide a solution. The solution was slowly dripped for 30 minutes and reacted for 12 hours. After completing the reaction, the acid was removed by using water and condensed by an evaporator. Then it was diluted by using methylamylketone (MAK) and methanol to provide a solution of MAK/methanol=4/1 (weight ratio) having a concentration of 15 wt %. The solution was introduced into 3 l separating funnel and added with n-heptane to removed a low molecular weight-containing monomer to provide a polymer (Mw=12,000, polydispersity=2.0) represented by the following Chemical Formula 11.

Examples 1 to 5

0.8 g of each polymer obtained from Synthesis Examples 1 to 5 was weighed and added with 0.2 g of cross-linking agent (Powderlink 1174) represented by the following Chemical Formula 3, and 2 mg of pyridinium p-toluene sulfonate, and then dissolved into 9 g of propyleneglycol monomethyletheracetate (hereinafter, referred to PGMEA) and filtered to provide sample solutions according to Examples 1 to 5, respectively.

Chemical Formula 3

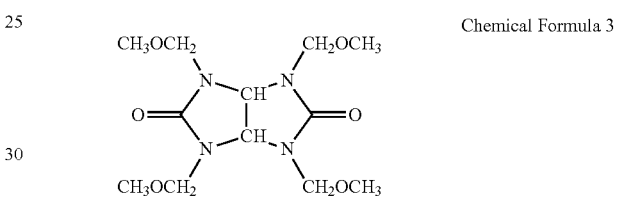

The sample solutions were respectively spin-coated on a silicon wafer and baked for 60 seconds at 240° C., forming 3000 Å-thick films.

Comparative Example 1

0.8 g of polymer obtained from Comparative Synthesis Example 1, 0.2 g of cross-linking agent (Cymel 303), and 2 mg of pyridinium p-toluene sulfonate were dissolved in 9 g of PGMEA and filtered to provide a sample solution according to Comparative Example 1.

The sample solutions were respectively spin-coated on a silicon wafer and baked for 60 seconds at 240° C., forming 3000 Å-thick films.

Measurement of Refractive Index and Extinction Coefficient

The films prepared according to the Examples 1 to 5 and Comparative Example 1 were measured regarding refractive index, n, and extinction coefficient, k. The measurement was performed using an ellipsometer (J. A. Woollam Co.). The results are provided in the following Table 1.

TABLE 1

| Samples used for film fabrication | Optical properties (193 nm) | | Optical properties (248 nm) | |
|---|---|---|---|---|
| | n (refractive index) | k (extinction coefficient) | n (refractive index) | k (extinction coefficient) |
| Comparative Example 1 | 1.44 | 0.70 | 1.97 | 0.27 |
| Example 1 | 1.33 | 0.24 | 2.22 | 0.39 |
| Example 2 | 1.42 | 0.30 | 2.31 | 0.40 |
| Example 3 | 1.38 | 0.23 | 2.28 | 0.37 |

TABLE 1-continued

| Samples used for film fabrication | Optical properties (193 nm) | | Optical properties (248 nm) | |
|---|---|---|---|---|
| | n (refractive index) | k (extinction coefficient) | n (refractive index) | k (extinction coefficient) |
| Example 4 | 1.41 | 0.51 | 2.27 | 0.41 |
| Example 5 | 1.46 | 0.29 | 2.34 | 0.36 |

As shown in Table 1, the films fabricated by respectively using the sample solutions according to Examples 1 to 5 had refractive indexes and absorption coefficients that show they can be used as anti-reflection coating layers at ArF (193 nm) and KrF (248 nm) wavelengths. On the contrary, while the film prepared by using the sample solution according to Comparative Example 1 had refractive index and absorbance (extinction coefficient) that show they can be used as anti-reflection coating layer at an ArF (193 nm) wavelength, it showed relatively low absorbance at a KrF 248 nm wavelength.

Evaluation of Pattern Properties

The sample solutions according to Examples 1 to 5 and Comparative Example 1 were respectively spin-coated on an aluminum-coated silicon wafer and baked for 60 seconds at 240° C., forming 3000 Å-thick films.

KrF photoresists were coated on the film and baked at 110° C. for 60 seconds. After the baking process, the resulting products were exposed to light using an exposure equipment (ASML (XT:1400, NA 0.93)) and developed with tetramethyl ammonium hydroxide (aqueous solution with a concentration of 2.38 wt %). Then, 90 nm line and space patterns of the films were examined using a field emission scanning electron microscope (FE-SEM). The results are shown in Table 2. The patterns were measured for exposure latitude (EL) margin depending on changes of exposure dose and depth of focus (DoF) margin depending on the distance from a light source. The results are shown in Table 2.

TABLE 2

| | Pattern properties | | |
|---|---|---|---|
| Samples used for film fabrication | EL margin ($^\Delta$mJ/exposure energy mJ) | DoF margin (μm) | Profile |
| Comparative Example 1 | 0.1 | 0.1 | undercut |
| Example 1 | 0.6 | 0.5 | cubic |
| Example 2 | 0.8 | 0.7 | cubic |
| Example 3 | 0.8 | 0.7 | cubic |
| Example 4 | 0.5 | 0.4 | cubic |
| Example 5 | 0.7 | 0.7 | cubic |

As shown in Table 2, the films prepared by respectively using the sample solutions according to Examples 1 to 5 had good results in terms of pattern profile and margin. The film prepared by using the sample solution according to Comparative Example 1 had a relatively poor result in terms of pattern profile or margin, which is believed to have resulted from an absorption characteristic difference at the KrF (248 nm) wavelength.

Evaluation of Etching Selectivity

The sample solutions according to Examples 1 to 5 and Comparative Example 1 were respectively spin-coated on an aluminum-coated silicon wafer and baked for 60 seconds at 200° C., forming 1500 Å-thick films. KrF photoresists were coated on the film and baked at 110° C. for 60 seconds. After the baking process, the resulting products were exposed to light using an exposure equipment ASML (XT:1450G, NA 0.93) and developed with tetramethyl ammonium hydroxide (aqueous solution with a concentration of 2.38 wt %) to obtain 90 nm line and space patterns.

The patterned specimens were respectively dry-etched using a $CHF_3/CF_4$ mixed gas and dry-etched using a $BCl_3/Cl_2$ mixed gas again. Finally, $O_2$ gas was used to remove all the organic material remnants. The resulting products were examined regarding their cross-section using an FE-SEM. The results are shown in the following Table 3.

TABLE 3

| Samples used for film fabrication | Pattern shape after etching |
|---|---|
| Comparative Example 1 | Tapered, coarse surface |
| Example 1 | Vertical |
| Example 2 | Vertical |
| Example 3 | Vertical |
| Example 4 | Vertical |
| Example 5 | Vertical |

As shown in Table 3, the patterned specimens prepared by using the sample solutions according to Examples 1 to 5 had good etching profiles, which shows they have excellent etch selectivity. The patterned specimen prepared by using the sample solution according to Comparative Example 1 had a taper phenomenon from the etching profile in the etching evaluation result, which shows a lack of sufficient selectivity in the etching conditions.

By way of summary and review, it may be beneficial to reduce the size of structural shapes in the microelectronics industry (and other related industries), including reducing the size of structural shapes by the manufacture of microscopic structures (e.g., micromachines, magneto-resist heads, etc.). In the microelectronics industry, it may be beneficial to reduce the size of microelectronic devices in order to provide a number of circuits in a given chip size.

Effective lithographic techniques may be required to achieve a reduction in the size of structural shapes. A typical lithographic process may involve the following processes: first, a resist may be coated on an underlying material, and the resist may be subjected to exposure to irradiation to form a resist layer; second the resist layer may be subjected to development to provide a patterned resist layer, and the underlying material exposed by the patterned resist layer may be etched to transfer a pattern into the underlying material; and third, after completion of the transfer, remaining portions of the resist layer may be removed.

However, such a resist may not provide resistance to the etching step to an extent that is sufficient to effectively transfer the desired pattern to an underlying material. In the case where a relatively thin resist layer is desired, an underlying material to be etched is relatively thick, a large etching depth is needed, or the use of a particular etchant is required depending on the type of underlying material, a resist underlayer may be used.

The resist underlayer may act as an intermediate layer between the resist layer and the underlying material that can be patterned by transfer from the patterned resist. The resist underlayer may be required to be able to receive the pattern from the patterned resist layer and to withstand the etching used to transfer the pattern to the underlying material.

Since underlayer materials may be difficult to apply to substrates, the use of chemical and physical vapor deposition, special solvents, and/or high-temperature baking may be required. However, these methods may have a high cost. Thus, a resist underlayer composition that can be applied by spin-coating techniques without high temperature baking may be beneficial.

Also, a resist underlayer composition that can be selectively etched using an overlying resist layer as a mask in an easy manner while being resistant to the etching used to pattern an underlying metal layer (e.g., using an underlayer as a mask) also may be beneficial. A resist underlayer composition that provides superior storage life-span properties and avoids unwanted interactions (e.g., acid pollution from a hard mask) with an imaging resist layer may be further beneficial. A resist underlayer composition that has particular optical properties against imaging irradiation at short wavelengths (e.g., 157 nm, 193 nm, 248 nm) also may be beneficial.

In summary, it may be beneficial for a resist underlayer composition to be an antireflective composition having high etching selectivity and sufficient resistance against multiple etching, and minimizing reflectivity between a resist and underlying material. Such a resist underlayer composition may be used in a lithographic technique that can produce a very fine semiconductor device (i.e., a semiconductor device having structural shapes with a reduced size).

According to embodiments, the aromatic ring-containing polymer for an underlayer of a resist may be applicable to a spin-on application technique; may have excellent optical properties, mechanical characteristics, and etching selectivity characteristics; may be useful for a short wavelength lithographic process; and may not cause acid contamination with other materials. A resist underlayer composition that includes the aromatic ring-containing polymer for an underlayer of a resist may have improved multi-etching resistance due to etching selectivity, and may not cause acid contamination with other materials (e.g., if the resist underlayer composition does not include an acid catalyst).

The resist underlayer composition including the aromatic ring-containing polymer for an underlayer of a resist may have a refractive index and absorption of an appropriate range as an antireflective layer in a deep ultraviolet (DUV) wavelength region (e.g., ArF (193 nm) or KrF (248 nm) wavelengths), and thus the resist underlayer composition may minimize reflectivity between the resist and the underlayer. Thereby, the resist underlayer composition may provide an improved lithographic structure in terms of pattern profile or margins. Also, the resist underlayer composition may have a high etching selectivity during a lithographic process and sufficient resistance against multiple etching. Thus, an etching profile of a resist underlayer that is an image to be transferred to an underlayer may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An aromatic ring-containing polymer for an underlayer of a resist, comprising:

a unit structure represented by Chemical Formula 1:

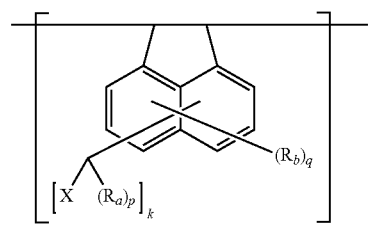

Chemical Formula 1 wherein, in Chemical Formula 1,
p is an integer ranging from 1 to 2, q is an integer ranging from 0 to 5, k is an integer ranging from 1 to 6, and q+k is an integer ranging from 1 to 6;
X is a hydroxyl group (—OH), a substituted or unsubstituted C1 to C10 alkoxy group, or a substituted or unsubstituted C6 to C30 aryloxy group;
$R_a$ is a substituted or unsubstituted C1 to C10 alkyl group, a substituted or unsubstituted C3 to C8 cycloalkyl group, a substituted or unsubstituted C6 to C30 aryl group, a substituted or unsubstituted C2 to C10 alkenyl group, or a halogen; and
$R_b$ is hydrogen, a substituted or unsubstituted C1 to C10 alkyl group, a substituted or unsubstituted C3 to C8 cycloalkyl group, or a substituted or unsubstituted C6 to C30 aryl group; and a unit structure represented by Chemical Formula 2:

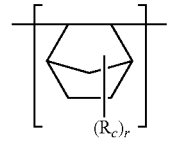

Chemical Formula 2 wherein, in Chemical Formula 2,
r is an integer ranging from 1 to 8; and
$R_c$ is hydrogen, a substituted or unsubstituted C1 to C10 alkyl group, a substituted or unsubstituted C3 to C8 cycloalkyl group, or a substituted or unsubstituted C6 to C30 aryl group.

2. The aromatic ring-containing polymer as claimed in claim 1, wherein the unit structure represented by Chemical Formula 2 is included in the aromatic ring-containing polymer at an amount of about 1 to about 10 moles based on 1 mole of the unit structure represented by Chemical Formula 1.

3. An aromatic ring-containing polymer for an underlayer of a resist, comprising:

a unit structure represented by Chemical Formula 1:

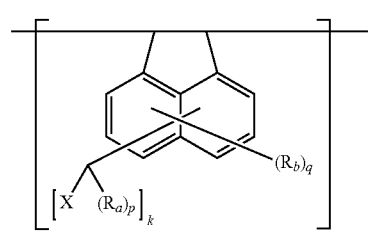

Chemical Formula 1 wherein, in Chemical Formula 1, p is an integer ranging from 1 to 2, q is an integer ranging from 0 to 5, k is an integer ranging from 1 to 6, and q+k is an integer ranging from 1 to 6;

X is a hydroxyl group (—OH), a substituted or unsubstituted C1 to C10 alkoxy group, or a substituted or unsubstituted C6 to C30 aryloxy group;

$R_b$ is hydrogen, a substituted or unsubstituted C1 to C10 alkyl group, a substituted or unsubstituted C3 to C8 cycloalkyl group, or a substituted or unsubstituted C6 to C30 aryl group; and $R_a$ is selected from the group of the following Chemical Formulae 1-1 to 1-12:

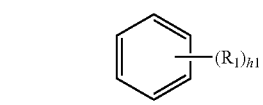
Chemical Formula 1-1

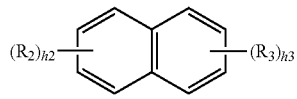
Chemical Formula 1-2

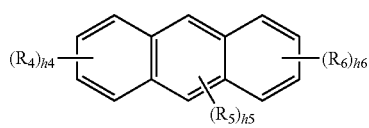
Chemical Formula 1-3

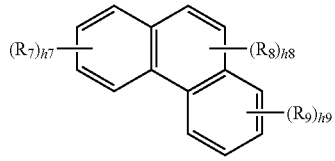
Chemical Formula 1-4

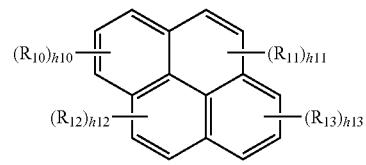
Chemical Formula 1-5

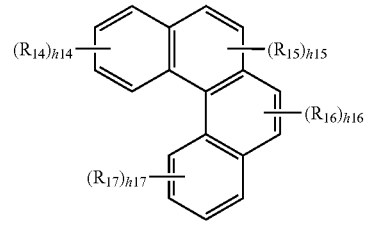
Chemical Formula 1-6

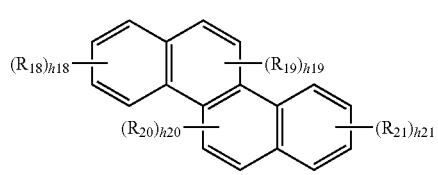
Chemical Formula 1-7

-continued

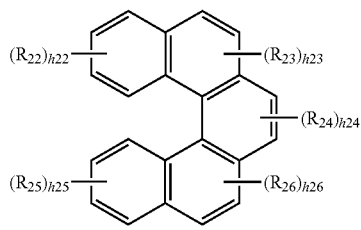
Chemical Formula 1-8

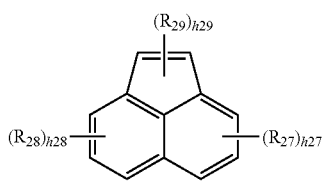
Chemical Formula 1-9

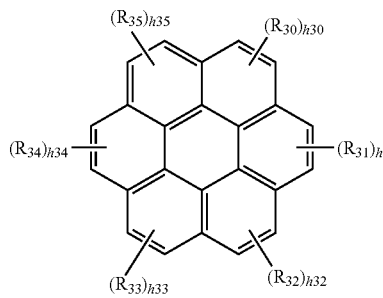
Chemical Formula 1-10

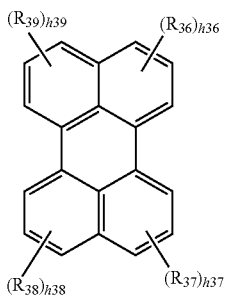
Chemical Formula 1-11

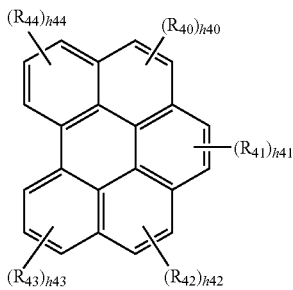
Chemical Formula 1-12 wherein, in Chemical Formulae 1-1 to 1-12, $R_1$ to $R_{44}$ are each independently hydrogen, a hydroxyl group (—OH), an alkyl group, an aryl group, an alkenyl group, or a halogen; and $h_1$ to $h_{44}$ are each independently an integer ranging from 0 to k−1, wherein k corresponds to a total number of hydrogen of each aromatic ring.

4. The aromatic ring-containing polymer as claimed in claim 1, wherein the aromatic ring-containing polymer has a weight average molecular weight of about 2,000 to about 10,000.

5. A resist underlayer, comprising:
a resist underlayer polymer, wherein the resist underlayer polymer is formed by cross-linking the aromatic ring-containing polymer as claimed in claim 1.

6. A resist underlayer composition, comprising:
an organic solvent; and
an aromatic ring-containing polymer including:
a unit structure represented by Chemical Formula 1:

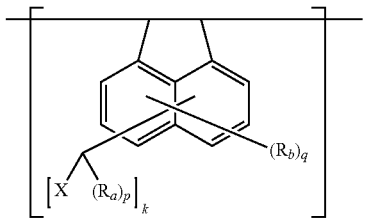

Chemical Formula 1 wherein, in Chemical Formula 1, p is an integer ranging from 1 to 2, q is an integer ranging from 0 to 5, k is an integer ranging from 1 to 6, and q+k is an integer ranging from 1 to 6;

X is a hydroxyl group (—OH), a substituted or unsubstituted C1 to C10 alkoxy group, or a substituted or unsubstituted C6 to C30 aryloxy group;

$R_a$ is a substituted or unsubstituted C1 to C10 alkyl group, a substituted or unsubstituted C3 to C8 cycloalkyl group, a substituted or unsubstituted C6 to C30 aryl group, a substituted or unsubstituted C2 to C10 alkenyl group, or a halogen; and $R_b$ is hydrogen, a substituted or unsubstituted C1 to C10 alkyl group, a substituted or unsubstituted C3 to C8 cycloalkyl group, or a substituted or unsubstituted C6 to C30 aryl group, and a unit structure represented by Chemical Formula 2:

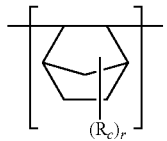

Chemical Formula 2 wherein, in Chemical Formula 2,
r is an integer ranging from 1 to 8; and
$R_c$ is hydrogen, a substituted or unsubstituted C1 to C10 alkyl group, a substituted or unsubstituted C3 to C8 cycloalkyl group, or a substituted or unsubstituted C6 to C30 aryl group.

7. The resist underlayer composition as claimed in claim 6, wherein the unit structure represented by Chemical Formula 2 is included in the aromatic ring-containing polymer in an amount of about 1 to about 10 moles based on 1 mole of the unit structure represented by Chemical Formula 1.

8. A resist underlayer composition, comprising:
an organic solvent; and
an aromatic ring-containing polymer including:
a unit structure represented by Chemical Formula 1:

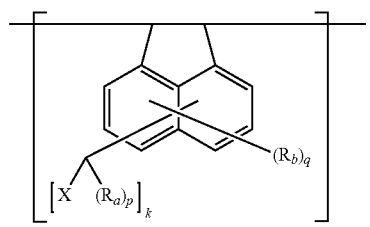

Chemical Formula 1 wherein, in Chemical Formula 1, p is an integer ranging from 1 to 2, q is an integer ranging from 0 to 5, k is an integer ranging from 1 to 6, and q+k is an integer ranging from 1 to 6;

X is a hydroxyl group (—OH), a substituted or unsubstituted C1 to C10 alkoxy group, or a substituted or unsubstituted C6 to C30 aryloxy group; and $R_b$ is hydrogen, a substituted or unsubstituted C1 to C10 alkyl group, a substituted or unsubstituted C3 to C8 cycloalkyl group, or a substituted or unsubstituted C6 to C30 aryl group; and $R_a$ is selected from the group of Chemical Formulae 1-1 to 1-12:

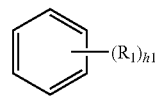

Chemical Formula 1-1

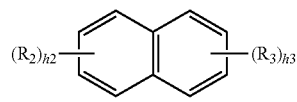

Chemical Formula 1-2

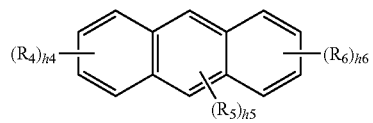

Chemical Formula 1-3

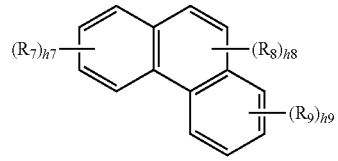

Chemical Formula 1-4

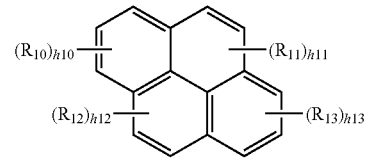

Chemical Formula 1-5

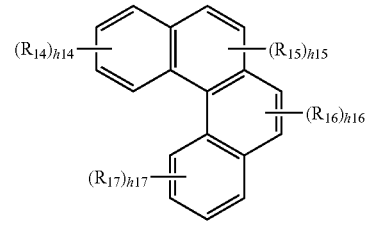

Chemical Formula 1-6

-continued

Chemical Formula 1-7

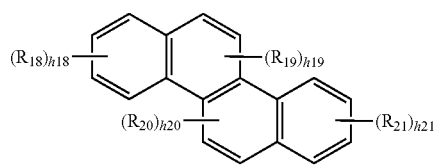

Chemical Formula 1-8

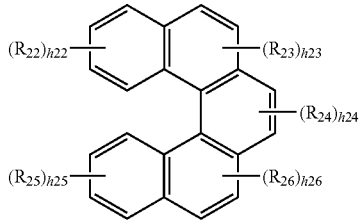

Chemical Formula 1-9

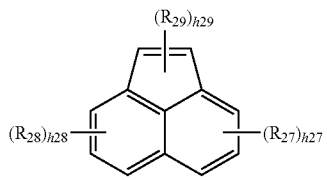

Chemical Formula 1-10

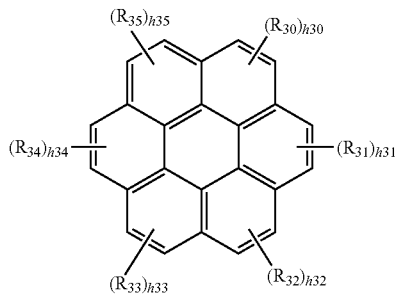

Chemical Formula 1-11

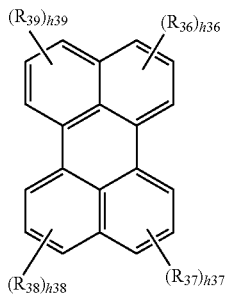

Chemical Formula 1-12

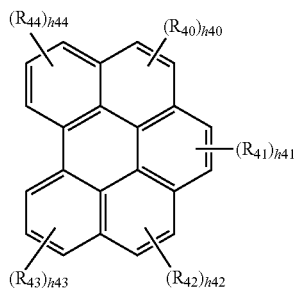

wherein, in Chemical Formulae 1-1 to 1-12,
$R_1$ to $R_{44}$ are each independently hydrogen, a hydroxyl group (—OH), an alkyl group, an aryl group, an alkenyl group, or a halogen; and
$h_1$ to $h_{44}$ are each independently an integer ranging from 0 to k−1, wherein k corresponds to a total number of hydrogen of each aromatic ring.

9. The resist underlayer composition as claimed in claim 6, wherein the aromatic ring-containing polymer is included in the resist underlayer composition at an amount of about 1 to about 20 wt %.

10. The resist underlayer composition as claimed in claim 6, further comprising a surfactant.

11. The resist underlayer composition as claimed in claim 6, further comprising a cross-linking component.

12. The resist underlayer composition as claimed in claim 6, wherein the aromatic ring-containing polymer has a weight average molecular weight of about 2,000 to about 10,000.

* * * * *